United States Patent
Kanarik et al.

(10) Patent No.: US 7,053,003 B2
(45) Date of Patent: May 30, 2006

(54) PHOTORESIST CONDITIONING WITH HYDROGEN RAMPING

(75) Inventors: Karen Jacobs Kanarik, Saratoga, CA (US); Aaron Eppler, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 10/975,209

(22) Filed: Oct. 27, 2004

(65) Prior Publication Data

US 2006/0089005 A1 Apr. 27, 2006

(51) Int. Cl.
*H01L 21/302* (2006.01)

(52) U.S. Cl. ............ 438/714; 438/705; 438/717; 438/725; 438/734; 216/47; 216/72

(58) Field of Classification Search ............ 438/705, 438/714, 717, 725, 734; 216/47, 72; 156/345.43; 257/1
See application file for complete search history.

(56) References Cited

U.S. PATENT DOCUMENTS

| | | | |
|---|---|---|---|
| 4,729,815 A | 3/1988 | Leung | |
| 5,807,789 A | 9/1998 | Chen et al. | |
| 5,843,226 A | 12/1998 | Zhao et al. | |
| 6,040,619 A | 3/2000 | Wang et al. | |
| 6,051,503 A | 4/2000 | Bhardwaj et al. | |
| 6,211,092 B1 * | 4/2001 | Tang et al. | 438/719 |
| 6,228,279 B1 * | 5/2001 | Armacost et al. | 216/67 |
| 6,326,307 B1 * | 12/2001 | Lindley et al. | 438/689 |
| 6,449,038 B1 | 9/2002 | Stolze | |

FOREIGN PATENT DOCUMENTS

| | | |
|---|---|---|
| JP | 57-181378 | * 11/1982 |
| JP | S63-13334 | 1/1988 |

OTHER PUBLICATIONS

International Search Report, mailed on Dec. 15, 2004.
U.S. Appl. No. 10/672,151 entitled "Etch with Ramping", by Jacobs et al., filed Sep. 26, 2003.

* cited by examiner

*Primary Examiner*—George A. Goudreau
(74) *Attorney, Agent, or Firm*—Beyer Weaver & Thomas LLP

(57) ABSTRACT

A method for etching a feature in an etch layer through a photoresist mask over a substrate is provided. A substrate with an etch layer disposed below a photoresist mask is placed in a process chamber. The photoresist mask is conditioned, wherein the conditioning comprises providing a conditioning gas comprising a hydrogen containing gas with a flow rate and at least one of a fluorocarbon and a hydrofluorocarbon with a flow rate to the process chamber; and energizing the conditioning gas to form the conditioning plasma. The conditioning plasma is stepped. An etch plasma is provided to the process chamber, wherein the etch plasma is different than the conditioning plasma. A feature is etched in the etch layer with the etch plasma.

20 Claims, 6 Drawing Sheets

PHOTORESIST CONDITIONING WITH HYDROGEN RAMPING

BACKGROUND OF THE INVENTION

The present invention relates to the use of a photoresist mask in semiconductor device production. More particularly, the present invention relates to etching through a photoresist mask during the production of a semiconductor device.

During semiconductor wafer processing, features of the semiconductor device are defined in the wafer using well-known patterning and etching processes. In these processes, a photoresist (PR) material may be deposited on the wafer and then is exposed to light filtered by a reticle. The reticle is generally a glass plate that is patterned with exemplary feature geometries that block light from propagating through the reticle.

After passing through the reticle, the light contacts the surface of the photoresist material. The light changes the chemical composition of the photoresist material such that a developer can remove a portion of the photoresist material. In the case of positive photoresist materials, the exposed regions are removed, and in the case of negative photoresist materials, the unexposed regions are removed. Thereafter, the wafer is etched to remove the underlying material from the areas that are no longer protected by the photoresist material, and thereby produce the desired features in the wafer.

To provide increased density, feature size is reduced. This may be achieved by reducing the critical dimension (CD) of the features, which requires improved photoresist resolution. One way of improving photoresist resolution is by providing thinner photoresist masks.

New photoresist materials (193 and 157 nm PR) are being pursued to produce small CD sizes in the photoresist, but these resists are less resistant to damage from the plasma than previous masks of DIV and 248 nm photoresist. Also, with the current single layer approach, increasingly thinner resist must be used to match the resolution of the features. This may not provide enough resist for the oxide etch and may cause other complications, such as striation. In order to keep up with shrinking feature dimensions, the industry has been investigating new technologies such as multi-layer approaches involving several processing steps. The switch to new technologies will undoubtedly be expensive and time-consuming.

SUMMARY OF THE INVENTION

To achieve the foregoing and in accordance with the purpose of the present invention a method for etching a feature in an etch layer through a photoresist mask over a substrate is provided. A substrate with an etch layer disposed below a photoresist mask is placed in a process chamber. The photoresist mask is conditioned, wherein the conditioning comprises providing a conditioning gas comprising a hydrogen containing gas with a flow rate and at least one of a fluorocarbon and a hydrofluorocarbon with a flow rate to the process chamber; and energizing the conditioning gas to form the conditioning plasma. The conditioning plasma is stepped. An etch plasma is provided to the process chamber, wherein the etch plasma is different than the conditioning plasma. A feature is etched in the etch layer with the etch plasma.

In another manifestation of the invention, a method for etching a feature in an etch layer through an antireflective coating and a photoresist mask over a substrate is provided. A substrate with an etch layer disposed below an antireflective coating and a photoresist mask is placed in a process chamber. The antireflective coating is opened, comprising providing a conditioning gas comprising a hydrogen containing gas with a flow rate and at least one of a fluorocarbon and a hydrofluorocarbon with a flow rate to the process chamber, and energizing the conditioning gas to form the conditioning plasma. The conditioning plasma is stopped after the antireflective coating is opened. An etch plasma is provided to the process chamber, wherein the etch plasma is different than the conditioning plasma. A feature is etched in the etch layer with the etch plasma through the antireflective coating and photoresist mask.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific-details. In other instances, well known process steps and/or structures have not been described in detail in order to not unnecessarily obscure the present invention.

Figure 1:
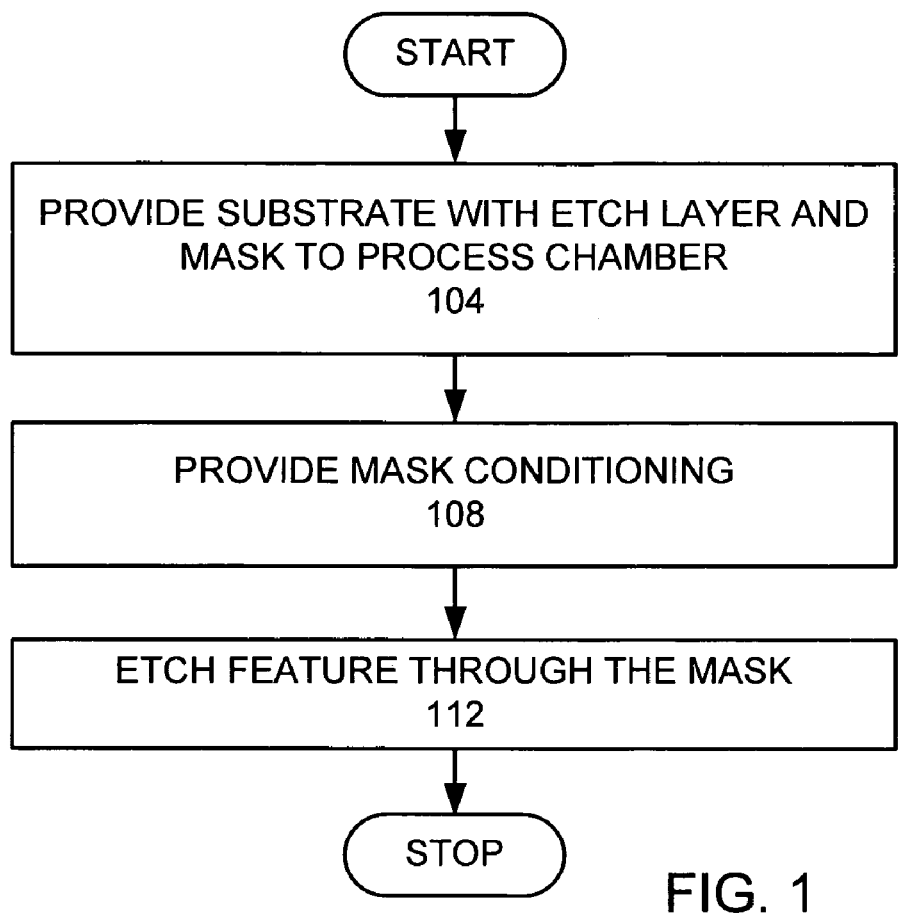
FIG. 1 is a high level flow chart of an embodiment of the invention.
Figure 2A:
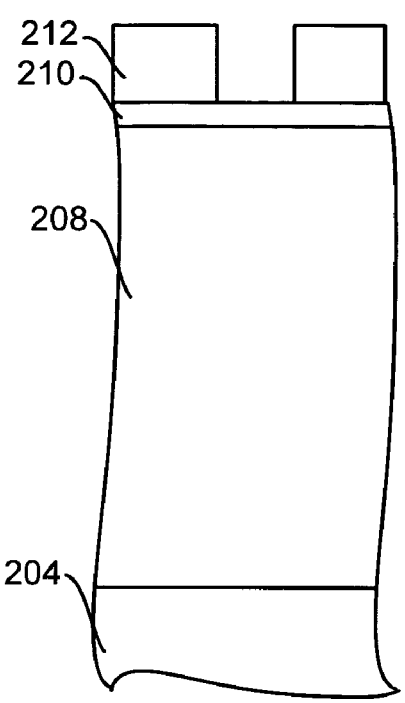
FIGS. 2A to 2C, are cross-sectional schematic view of a substrate, which is processed according to the invention.

FIG. 1 is a high level flow chart of an embodiment of the invention. A substrate with an etch layer and a mask is provided to a process chamber (step 104). FIG. 2A is a cross-sectional schematic view of a substrate 204, which may be part of a wafer or a layer over a wafer. An etch layer 208 is formed over the substrate 204. Although the etch layer 208 is shown to be on the substrate 204, in other embodiments one or more layers may be between the etch layer 208 and the substrate 204. A mask 212 is formed over the etch layer 208. In this example, a BARC (bottom anti-reflective coating) 210, is placed between the etch layer 208 and the mask 212. In the preferred embodiment, the etch layer 208 is a single layer. Preferably the single layer is uniform through out the thickness of the single layer forming the etch layer.

Figure 3:
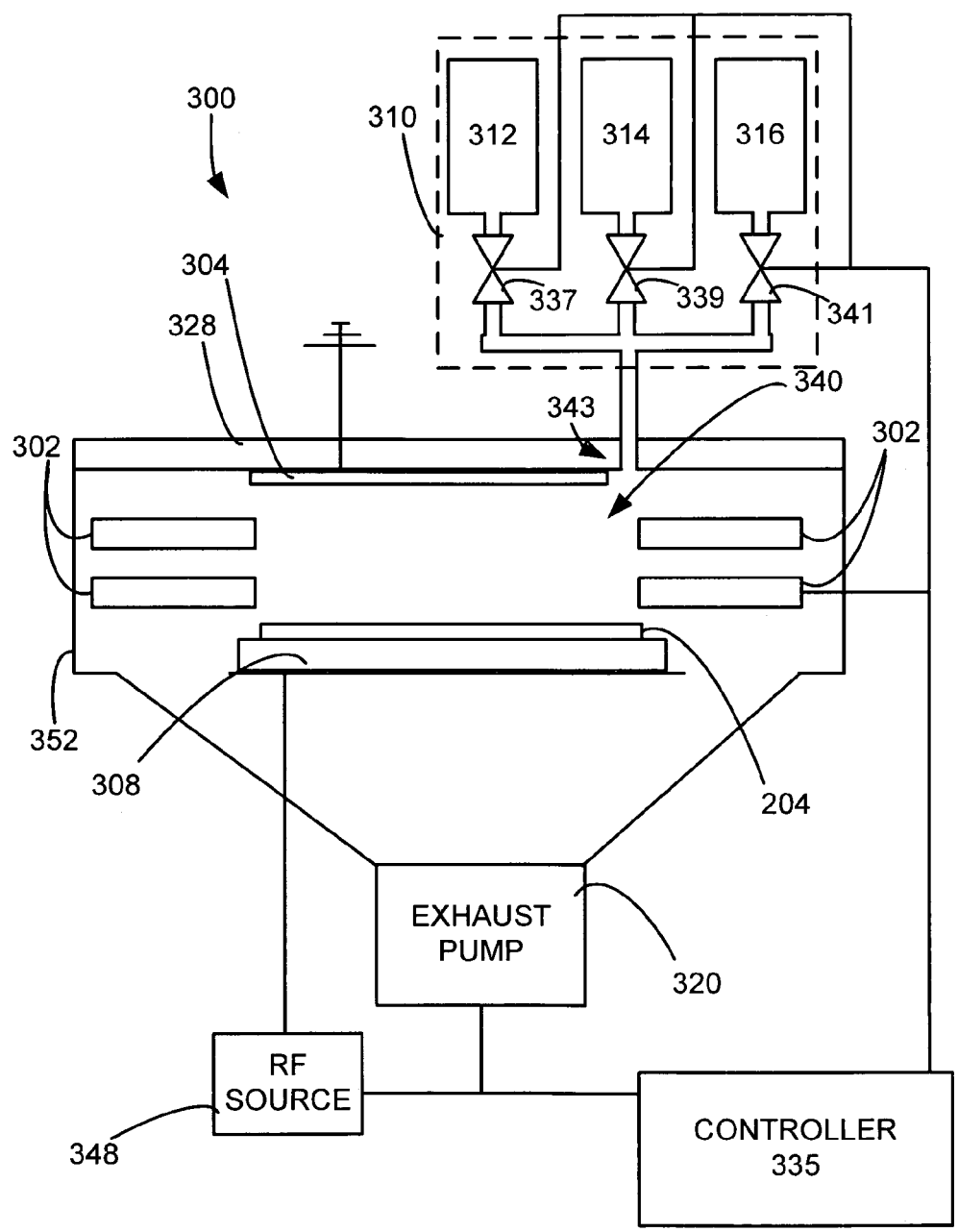
FIG. 3 is a schematic view of a process chamber that may be used in the preferred embodiment of the invention.

FIG. 3 is a schematic view of a process chamber 300 that may be used in the preferred embodiment of the invention. In this embodiment, the plasma processing chamber 300 is a 200 mm 2300 Exelan made by Lam® Research Corp. of Fremont, Calif., which comprises confinement rings 302, an upper electrode 304, a lower electrode 308, a gas source 310, and an exhaust pump 320. The gas source 310 may comprise a first gas source 312, a second gas source 314, and a third gas source 316. Within plasma processing chamber 300, the substrate wafer 204, over which the etch layer is deposited, is positioned upon the lower electrode 308. The lower electrode 308 incorporates a suitable substrate chucking mechanism (e.g., electrostatic, mechanical clamping, or the like) for holding the substrate wafer 204. The reactor top 328 incorporates the upper electrode 304 disposed immediately opposite the lower electrode 308. The upper electrode 304, lower electrode 308, and confinement rings 302 define the confined plasma volume 340. Gas is supplied to the confined plasma volume by gas source 310 through a gas inlet 343 and is exhausted from the confined plasma volume through the confinement rings 302 and an exhaust port by the exhaust pump 320. The exhaust pump 320 forms a gas outlet for the plasma processing chamber. In this embodiment, the upper electrode 304 is grounded. A RF source 348 is electrically connected to the lower electrode 308. Chamber walls 352 define a plasma enclosure in which the confinement rings 302, the upper electrode 304, and the lower electrode 308 are disposed. The RF source 348 may comprise a 27 MHz power source and a 2 MHz power source. Different combinations of connecting RF power to the electrode are possible. A controller 335 is controllably connected to the RF source 348, the exhaust pump 320, the confinement rings 302, a first control valve 337 connected to the first gas source 312, a second control valve 339 connected to the second gas source 314, and a third control valve 341 connected to the third gas source 316. The gas inlet 343 provides gas from the gas sources 312, 314, 316 into the plasma processing enclosure. A showerhead may be connected to the gas inlet 343. The gas inlet 343 may be a single inlet for each gas source or a different inlet for each gas source or a plurality of inlets for each gas source or other possible combinations. Other embodiments of the invention may use other types of plasma process chambers, such as the 2300 Exelan made by Lam Research Inc.

Figure 8A:
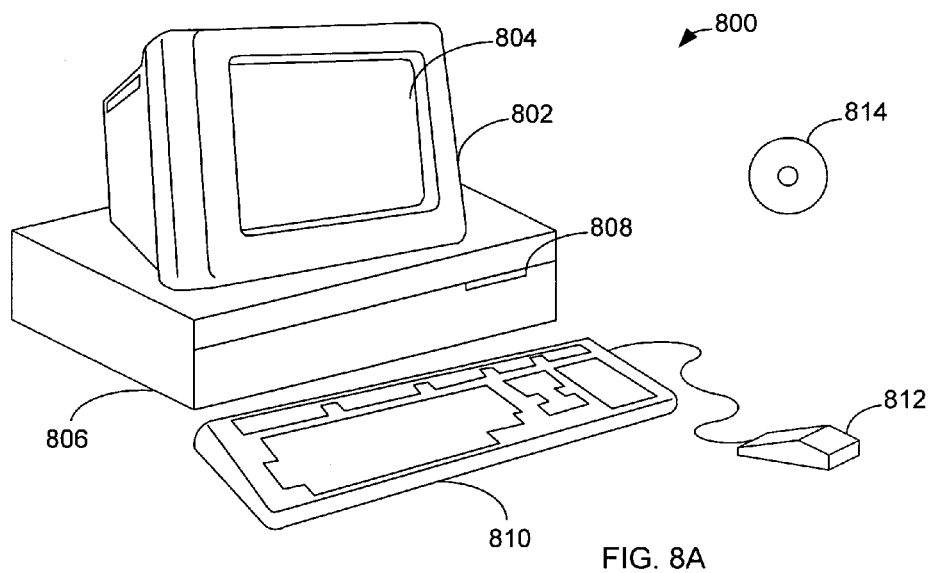
FIGS. 8A and 8B illustrate a computer system, which is suitable for implementing a controller used in embodiments of the present invention.
Figure 8B:
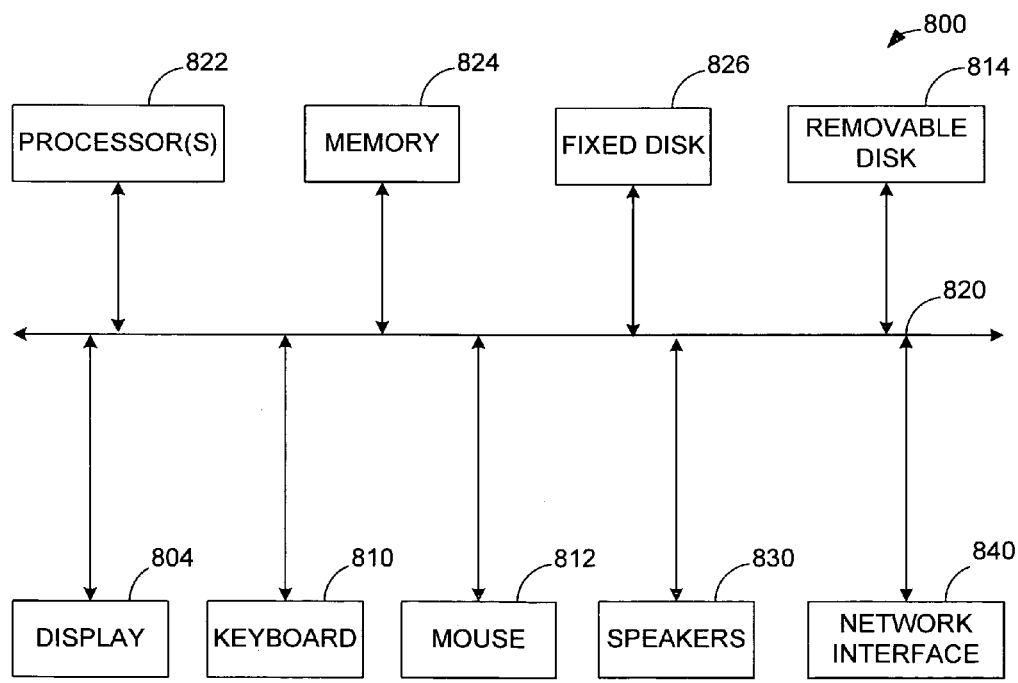

FIGS. 8A and 8B illustrate a computer system 800, which is suitable for implementing a controller 335 used in embodiments of the present invention. FIG. 8A shows one possible physical form of the computer system. Of course, the computer system may have many physical forms ranging from an integrated circuit, a printed circuit board, and a small handheld device up to a huge super computer. Computer system 800 includes a monitor 802, a display 804, a housing 806, a disk drive 808, a keyboard 810, and a mouse 812. Disk 814 is a computer-readable medium used to transfer data to and from computer system 800.

FIG. 8B is an example of a block diagram for computer system 800. Attached to system bus 820 is a wide variety of subsystems. Processor(s) 822 (also referred to as central processing units, or CPUs) are coupled to storage devices, including memory 824. Memory 824 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 826 is also coupled bi-directionally to CPU 822; it provides additional data storage capacity and may also include any of the computer-readable media described below. Fixed disk 826 may be used to store programs, data, and the like and is typically a secondary storage medium (such as a hard disk) that is slower than primary storage. It will be appreciated that the information retained within fixed disk 826 may, in appropriate cases, be incorporated in standard fashion as virtual memory in memory 824. Removable disk 814 may take the form of any of the computer-readable media described below.

CPU 822 is also coupled to a variety of input/output devices, such as display 804, keyboard 810, mouse 812, and speakers 830. In general, an input/output device may be any of video displays, track balls, mice, keyboards, microphones, touch-sensitive displays, transducer card readers, magnetic or paper tape readers, tablets, styluses, voice or handwriting recognizers, biometrics readers, or other computers. CPU 822 optionally may be coupled to another computer or telecommunications network using network interface 840. With such a network interface, it is contemplated that the CPU might receive information from the network, or might output, information to the network in the course of performing the above-described method steps. Furthermore, method embodiments of the present invention may execute solely upon CPU 822 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

Figure 4:
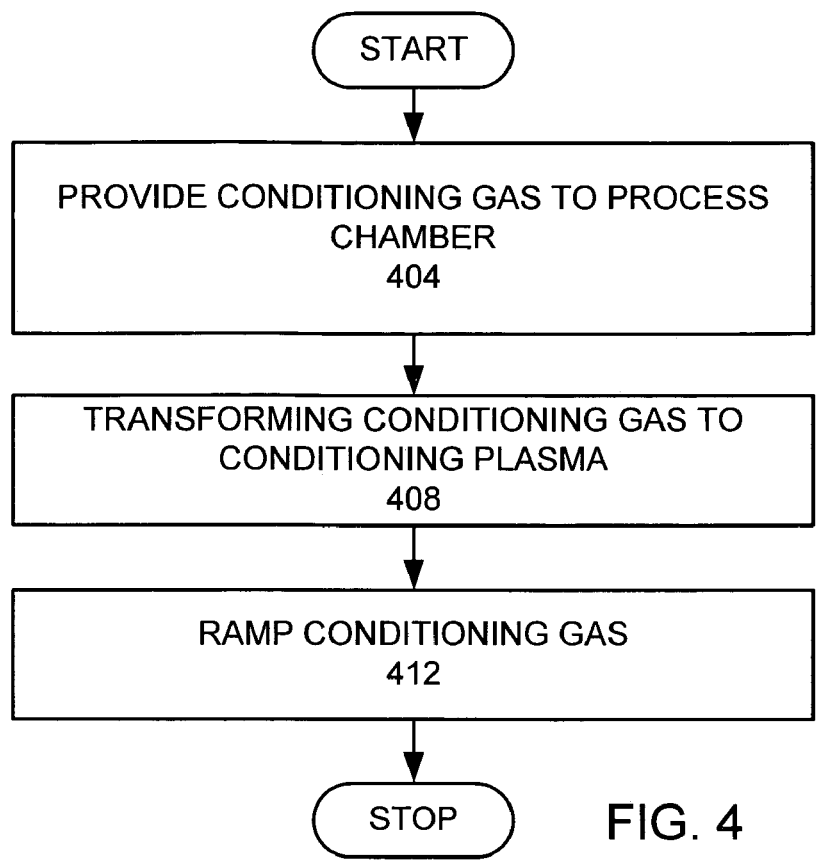
FIG. 4 is a more detailed flow chart of an embodiment of the mask conditioning with a hydrogen ramp.

A mask conditioning is then provided (step 108). FIG. 4 is a more detailed flow chart of an embodiment of the mask conditioning with an hydrogen ramp (step 108). This is done by providing a photoresist conditioning gas to the process chamber 300 (step 404). The photoresist conditioning gas comprises a hydrogen containing gas, such as $H_2$, and at least one of a fluorocarbon and hydrofluorocarbon, which is in this example $CF_4$. A diluent, such as argon, may be also added to the photoresist conditioning gas. Therefore, in this example, the first gas of $H_2$ is provided from the first gas source 312 and a second gas of $CF_4$ is provided from the second gas source 314. The photoresist conditioning gas may then be transformed into the photoresist conditioning plasma (step 408). Preferably, the photoresist conditioning plasma is formed in situ in the process chamber. In the process chamber 300 illustrated above, this would be done by providing RF power from the RF power source 348 to the lower electrode 308, which excites the conditioning gas to transform the conditioning gas to the conditioning plasma.

Figure 2B:
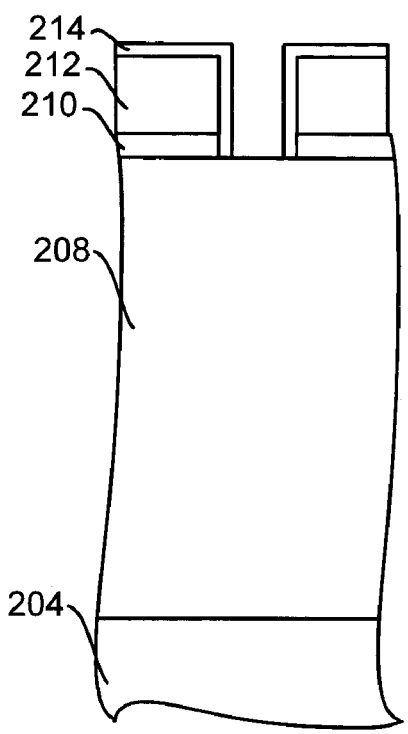
Figure 5:
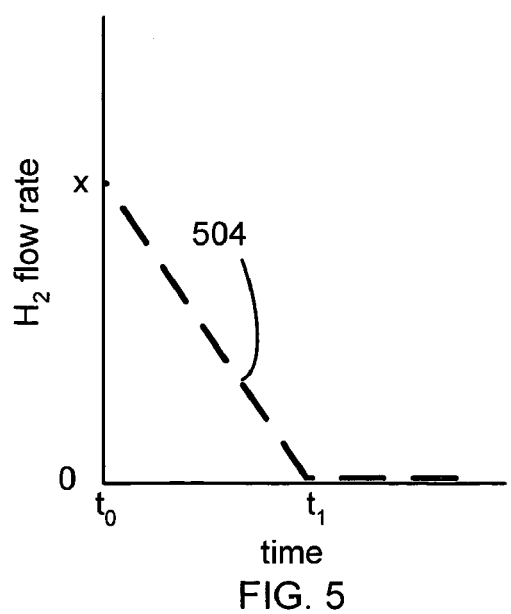
FIG. 5 is a graph of the flow rate of $H_2$ in the conditioning gas versus time during the conditioning process.

In the reactor, the conditioning is optimized by ramping the conditioning gas. (step 412). The conditioning gas has a ratio of the flow rate of the hydrogen containing gas to the at least one of a fluorocarbon and hydrofluorocarbon gas. During the ramping of the conditioning gas the ratio of the flow rate of the hydrogen containing gas to the at least one of a fluorocarbon and hydrofluorocarbon gas is decreased. In an example this is done by a ramping down of the flow of the hydrogen containing gas, such as $H_2$ gas, while the flow rate of the fluorohydrocarbon or hydrocarbon is kept about constant. FIG. 5 is a graph of the flow rate of $H_2$ in the conditioning gas versus time during the conditioning process. As shown the graph of the flow rate of $H_2$ 504 starts initially at to with a flow rate of x and then is ramped down so that at t1 the flow rate of $H_2$ goes to zero, as shown, so that the condition gas is only $CF_4$. Generally, the ramping down the flow of the $H_2$ gas causes a ramping down of the concentration of $H_2$ in the conditioning gas. In this embodiment, the photoresist conditioning plasma etches through exposed portions of the BARC 210, while leaving a hardened photoresist mask 212, that is more etch resistant. FIG. 2B is a cross-sectional schematic view of the substrate 204, the etch layer 208, the mask 212, and the BARC 210 after the photoresist conditioning, which opens the BARC 210. After the conditioning process is completed, it has been found that the CD of apertures in the photoresist mask has been reduced.

In other embodiments, the flow of $H_2$ may be held constant and the flow of $CF_4$ may be ramped up. In these embodiments, the ratio of the flow of the hydrogen containing gas ($H_2$) to the flow of the hydrofluorocarbon or fluorocarbon ($CF_4$) is ramped down over time.

Without wishing to be bound by theory, it is believed that the conditioning process forms a protective layer 214 over the photoresist 212, which causes the reduction of the CD in addition to hardening the photoresist mask. Since the thickness of the etch mask actually increases during the opening of the BARC 210, the invention provides a BARC open with a nearly infinite resist selectivity.

Preferably, the conditioning provides at least 100:1 photoresist selectivity when opening the BARC. On the other hand, it may be possible that the presence of hydrogen in the conditioning plasma may cause a chemical reaction that hardens the etch mask instead of or in conjunction with the forming the protective layer.

Figure 2C:
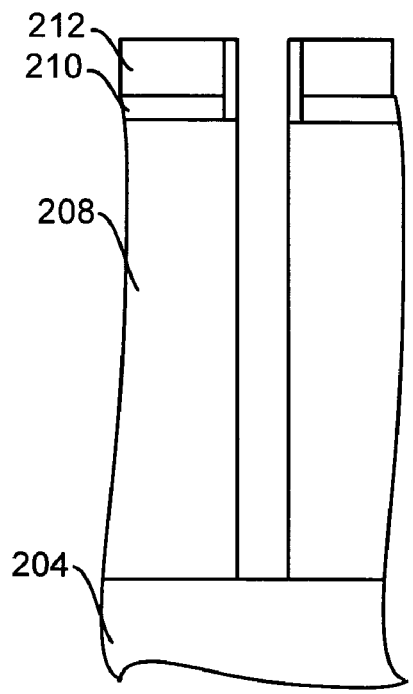

Features are then etched into the etch layer through the conditioned resist mask (step 112). In this embodiment the etch layer 208 is a silicon oxide dielectric. Although some of the photoresist is removed during the etch, it has been found that the conditioning hardens the photoresist mask, so that less photoresist is removed during the etch. The hardening may be either by forming a layer over the photoresist or by hardening the photoresist itself. FIG. 2C is a cross-sectional schematic view of the substrate 204, the etch layer 208, the mask 212, and the BARC 210 after the oxide etch is completed.

Figure 6:
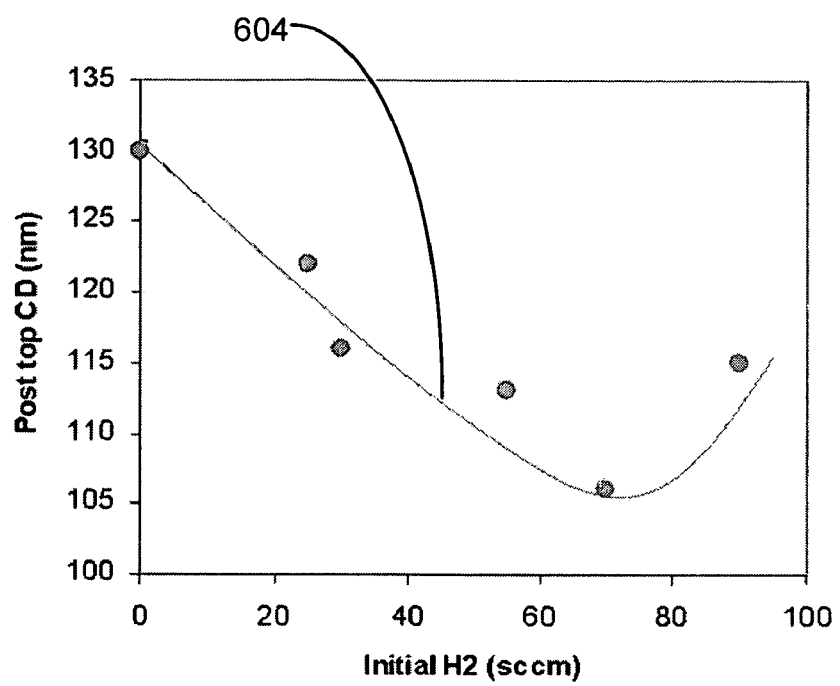
FIG. 6 is a graph of final top CD-tuned reduction from using the inventive ramping treatment by changing the initial flow of the ramp.

By varying the initial or final $H_2$ flow rate or the ramping time or profile, the CD reduction may also be varied and controlled. FIG. 6 is a graph of final top CD-tuned reduction from 0–25 nm using the $H_2$ ramping treatment by changing the initial flow of the ramp. As seen from the data points and curve 604, when no $H_2$ is provided, then the top CD is 130 nm. When the $H_2$ flow starts at between 40 and 90 sccm and is linearly ramped down, the top CD is about 100 nm, which is a reduction of between 25–20 nm.

Figure 7:
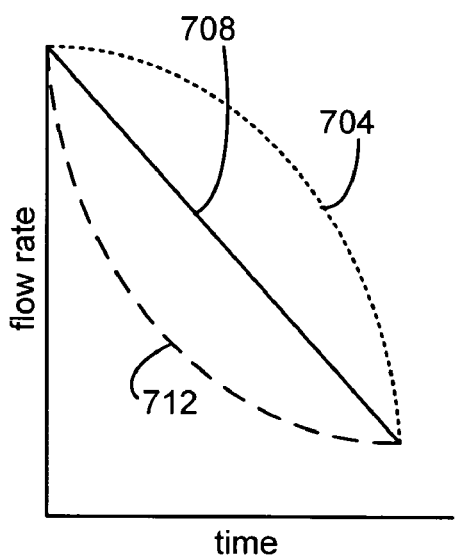
FIG. 7 is a graph of different ramp schemes for the flow rate of $H_2$.

Other embodiments may use other ramp profiles, other than a linear ramp. FIG. 7 is a graph of different ramp schemes for the flow rate of $H_2$. A linear ramp 708 is a ramp where the flow rate decreases linearly over time, as shown. A sub-linear ramp 712 is a ramp where the flow rate decreases over time in a sub-linear fashion, as shown. An example of this type of ramping is an exponential, quadratic, or hyperbolic function, but many other more complicated functions are also suitable. A super-linear ramp 704 is a ramp where the flow rate decreases over time in a super-linear fashion, as shown. All of the ramps in this graph are continuous ramps that can be approximated in practice either with software or with a series of discrete steps that mimic the ramp.

Figure 9:
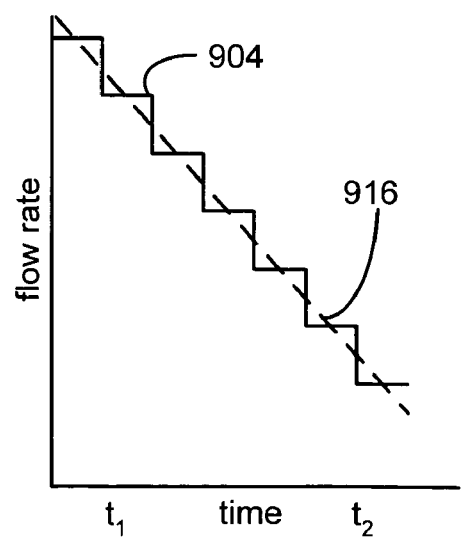
FIG. 9 is a graph of a discrete and discontinuous step function ramp.

FIG. 9 is a graph of a discrete and discontinuous step function ramp 904. This discrete ramp 904 decreases flow over time in discrete steps. Dashed line 916 shows that the discrete ramp 904 provides a linear decrease of flow over time. In this example, seven discrete steps are shown. Other embodiments may have more or fewer steps. Preferably, a step function ramp has at least three steps. More preferably, the step function ramp has at least five steps. More preferably, the step function ramp has at least seven steps. Most preferably, the step function ramp has as many steps as the software can reasonably provide, to most closely mimic a continuous ramp. For ramping using discrete steps, the duration of the ramping time is defined from the end of the first step to the beginning of the last step. Under such a definition, the ramping is from time $t_1$ to $t_2$, as shown. The steps may be individually manually entered or may be generated by a computer once endpoints are specified. Generally, computer readable media 814 has computer readable object code that instructs the controller 335 to provided the discrete or continuous ramping.

The $H_2$-ramp is an integral part of the treatment because it takes advantage of distinct behaviors of different $H_2$ to $CF_4$ ratios. Three regimes of behavior have been observed for $CF_4/H_2$ mixtures. $CF_4$-only plasmas etch photoresist, BARC, and oxide. A process that uses only $CF_4$ alone for a BARC open may remove up to half the photoresist mask. This causes an increase in the CD and used up the photoresist. Small additions of $H_2$ to a $CF_4$ plasma will also etch, but with sufficient $H_2$ flow, the mixture produces a smooth deposition layer on the resist. This layer protects the resist, etches the BARC, but does not etch oxide and causes etch-stop. Finally, high $H_2$ additions are found to etch the photoresist but do not etch the BARC or oxide, similar to the etching behavior of $H_2$-only plasmas, which also may increase the CD. The crossover flows between these three distinct regimes depends on the plasma power and the $CF_4$ flow. For example, at 200–400 W at 27 MHz with 60–100 sccm $CF_4$, the crossover flows are ~7 and ~60 sccm $H_2$. Without the ramp, there would be a trade-off between either etching or depositing regimes. In order to have the benefits of the depositing regime, but without the etch-stop, the mixture is ramped from depositing regime to an etching regime (higher to lower $H_2$ flow).

The invention reduces resist loss by conditioning soft photoresist, such as 193 and 157 nm photoresist to be more etch resistant. The invention is able to reduce the CD of a feature by allowing a thinner resist mask, which provides higher resolution and by providing an oxide etch feature that has a smaller CD than the CD of the original masking pattern (in one embodiment by up to 30 nm (~25% reduction in CD). This CD reduction is significant, because as device features shrink to <100 nm, CD control on the nanometer scale can be directly linked to device performance due to the increasingly strict CD tolerances. In addition, the inventive process reduces striation. Striation can increase defects.

The inventive ramp provides additional tuning parameters, such as initial flow rates, final flow rates, and ramp profiles to provide improved tuning to obtain various desired results.

Other embodiments of the invention would ramp a hydrogen containing component gas, such as $CHF_3$, $CH_2F_2$, $CH_3F$, $CH_4$. Examples of fluorocarbons and hydrofluorocarbons that may be used in other embodiments are $CHF_3$, $CH_2F_2$, and $CH_3F$.

In an embodiment of the invention, the conditioning gas to form a conditioning plasma comprises $H_2$ and $CF_4$, wherein the initial flow ratio of $H_2$ to $CF_4$ is between 1:10 and 2:1. More preferable, the initial flow ratio of $H_2$ to $CF_4$ is between 1:8 and 3:2. Most preferable, the initial flow ratio of $H_2$ to $CF_4$ is between 1:2 and 5:4. At the end of the ramp, preferably the final flow ratio of $H_2$ to $CF_4$ is between 0 and 1:20.

For a 2300 Exelan the initial flow rate of $H_2$ is between 5 to 200 sccm. More preferably, the initial flow rate of $H_2$ is between 10 to 150 sccm. Most preferably, the initial flow rate of $H_2$ is between 15 to 100 sccm. Preferably, the flow rate of $CF_4$ is between 20 to 200 sccm. More preferably, the flow rate of $CF_4$ is between 20 to 150 sccm. Most preferably, the flow rate of $CF_4$ is between 30 to 120 sccm. Preferably, 50 to 900 Watts at about 27 MHz is provided during the conditioning process. More preferably, 100 to 800 Watts at about 27 MHz is provided during the conditioning process. Preferably, 0–300 Watts at about 2 MHz is also provided.

Preferably, the inventive process is used to condition a photoresist etch mask overlying a dielectric layer. The dielectric layer may be organic or inorganic material, such as silicon oxide, silicon nitride, and organosilicate glass.

Preferably, the conditioning of the photoresist and opening of the BARC is completed with a single ramp, so that the ramp is not repeated, but only performed once before the dielectric etch is initiated.

In other embodiments, other antireflective coatings (ARC) may be used instead of BARC (bottom anti reflective coatings) or no ARC at all.

While this invention has been described in terms of several preferred embodiments, there are alterations, permutations, and various substitute equivalents, which fall within the scope of this invention. It should also be noted that there are many alternative ways of implementing the methods and apparatuses of the present invention. It is therefore intended that the following appended claims be interpreted as including all such alterations, permutations, and various substitute equivalents as fall within the true spirit and scope of the present invention.

What is claimed is:

1. A method for etching a feature in an etch layer through a photoresist mask over a substrate, comprising:
   placing a substrate with an etch layer disposed below a photoresist mask in a process chamber;
   conditioning the photoresist mask, comprising:
      providing a conditioning gas comprising a hydrogen containing gas with a flow rate and at least one of a fluorocarbon and a hydrofluorocarbon with a flow rate to the process chamber;
      energizing the conditioning gas to form the conditioning plasma;
      ramping the conditioning gas so that a ratio of the flow rate of the hydrogen containing gas and the flow rate of the at least one of the fluorocarbon and hydrofluorocarbon is ramped down; and
      stopping the conditioning plasma;
   providing an etch plasma to the process chamber, wherein the etch plasma is different than the conditioning plasma; and
   etching a feature in the etch layer with the etch plasma.

2. The method, as recited in claim 1, wherein the hydrogen containing gas is $H_2$.

3. The method, as recited in claim 2, wherein, the conditioning plasma is an in situ plasma.

4. The method, as recited in claim 3, wherein a BARC is disposed between the photoresist mask and the etch layer, wherein the conditioning of the photoresist mask opens through the BARC.

5. The method, as recited in claim 4, wherein the ramping the conditioning gas is a non-linear ramping.

6. The method, as recited in claim 4, wherein the conditioning provides at least 100:1 photoresist selectivity when opening the BARC.

7. The method, as recited in claim 6, wherein the etch layer is a dielectric layer.

8. The method, as recited in claim 1, wherein the hydrogen containing gas is $H_2$ and the at least one of a fluorocarbon and hydrofluorocarbon is $CF_4$.

9. The method, as recited is claim 7, wherein the conditioning gas has an initial $H_2$ to $CF_4$ flow ratio between 1:10 and 2:1 and a final $H_2$ to $CF_4$ flow ratio between 0 and 1:20.

10. The method, as recited in claim 1, wherein the hydrogen containing gas is $H_2$ and the at least one of a fluorocarbon and hydrofluorocarbon is $CF_4$, wherein the conditioning plasma is an in situ plasma.

11. The method, as recited in claim 10, wherein the conditioning gas has an initial to $CF_4$ flow ratio between 1:10 and 2:1 and a final $H_2$ to $CF_4$ flow ratio between 0 and 1:20.

12. A method for etching a feature in an etch layer through a photoresist mask over a substrate, comprising:
   placing a substrate with an etch layer disposed below a photoresist mask in a process chamber;
   conditioning the photoresist mask, comprising:
      providing a conditioning gas comprising a hydrogen containing gas with a flow rate and at least one of a fluorocarbon and a hydrofluorocarbon with a flow rate to the process chamber;
      energizing the conditioning gas to form the conditioning plasma, wherein a BARC is disposed between the photoresist mask and the etch layer, wherein the conditioning of the photoresist mask opens the BARC with at least 100:1 photoresist selectivity when opening the BARC; and
      stopping the conditioning plasma;
   providing an etch plasma to the process chamber, wherein the etch plasma is different than the conditioning plasma; and
   etching a feature in the etch layer with the etch plasma.

13. The method, as recited in claim 4, wherein the etch layer is a dielectric layer.

14. A method for etching a feature in an etch layer through an antireflective coating and a photoresist mask over a substrate, comprising:

placing a substrate with an etch layer disposed below an antireflective coating and a photoresist mask in a process chamber;

opening the antireflective coating, comprising:
providing a conditioning gas comprising a hydrogen containing gas with a flow rate and at least one of a fluorocarbon and a hydrofluorocarbon with a flow rate to the process chamber; and
energizing the conditioning gas to form the conditioning plasma; and
stopping the conditioning plasma after the antireflective coating is opened;

providing an etch plasma to the process chamber, wherein the etch plasma is different than the conditioning plasma; and etching a feature in the etch layer with the etch plasma through the antireflective coating and photoresist mask.

15. The method, as recited in claim 14, further comprising ramping the conditioning gas so that a ratio of the flow rate of the hydrogen containing gas and the flow rate of the at least one of the fluorocarbon and hydrofluorocarbon is ramped down.

16. The method, as recited in claim 15, wherein the hydrogen containing gas is $H_2$.

17. The method, as recited in claim 15, wherein the conditioning plasma is as in situ plasma.

18. The method, as recited in claim 15, wherein the conditioning provides at least 100:1 photoresist selectivity when opening the ARC.

19. The method, as recited in claim 15, wherein the hydrogen containing gas is $H_2$ and the at least one of a fluorocarbon and hydrofluorocarbon is $CF_4$.

20. The method, as recited in claim 19, wherein the conditioning gas has an initial $H_2$ to $CF_4$ flow ratio between 1:2 and 5:4 and a final $H_2$ to $CF_4$ flow ratio between 0 and 1:20.

* * * * *